(12) United States Patent
Hirono et al.

(10) Patent No.: US 7,896,968 B2
(45) Date of Patent: Mar. 1, 2011

(54) WINDING TYPE PLASMA CVD APPARATUS

(75) Inventors: Takayoshi Hirono, Chigasaki (JP); Isao Tada, Chigasaki (JP); Atsushi Nakatsuka, Chigasaki (JP); Masashi Kikuchi, Chigasaki (JP); Hideyuki Ogata, Chigasaki (JP); Hiroaki Kawamura, Sammu (JP); Kazuya Saito, Sammu (JP); Masatoshi Sato, Sammu (JP)

(73) Assignee: Ulvac, Inc., Kanagawa (JP)

( * ) Notice: Subject to any disclaimer, the term of this patent is extended or adjusted under 35 U.S.C. 154(b) by 94 days.

(21) Appl. No.: 11/792,810

(22) PCT Filed: May 10, 2006

(86) PCT No.: PCT/JP2006/009387
§ 371 (c)(1),
(2), (4) Date: Jun. 11, 2007

(87) PCT Pub. No.: WO2006/121068
PCT Pub. Date: Nov. 16, 2006

(65) Prior Publication Data
US 2008/0006206 A1    Jan. 10, 2008

(30) Foreign Application Priority Data
May 10, 2005   (JP)  .............................. 2005-137671

(51) Int. Cl.
C23C 16/00    (2006.01)
C23F 1/00     (2006.01)
H01L 21/306   (2006.01)
(52) U.S. Cl. ................ 118/718; 156/345.2; 204/298.24
(58) Field of Classification Search .................. 118/718; 156/345.2; 204/298.24
See application file for complete search history.

(56) References Cited

U.S. PATENT DOCUMENTS
4,412,507 A  * 11/1983  Kitamoto et al. ............ 118/718

(Continued)

FOREIGN PATENT DOCUMENTS
JP      64-075680 A      3/1989

(Continued)

*Primary Examiner*—Karla Moore
*Assistant Examiner*—Nathan K Ford
(74) *Attorney, Agent, or Firm*—Carothers & Carothers

(57) ABSTRACT

The object of this invention is to provide a winding type plasma CVD apparatus in which quality of a layer can be made uniform by supplying a reaction gas uniformly to a deposition area of a film, and can perform a self-cleaning process of a deposition portion in the path of deposition onto the film.

A film (22) is supported between a pair of movable rollers (33, 34) arranged on the upstream side and downstream side of the deposition portion (25) with regard to the traveling direction of the film, and then the film (22) is made to travel substantially linearly at the deposition position. Consequently, the distance between a shower plate (37) and the film (22) is kept constant, and the quality of the layer is made homogeneous. The film is heated by means of a metal belt (40) traveling simultaneously on the back side of the film. The moveable rollers (33, 34) ascend from the deposition position to the self-cleaning position, and the film (22) can be separated from the shower plate (37). Self-cleaning can be carried out in the path of the deposition onto the film by closing the aperture of a mask (51) with a shutter (65), thereby preventing leakage of cleaning gas.

12 Claims, 7 Drawing Sheets

U.S. PATENT DOCUMENTS

| | | | |
|---|---|---|---|
| 5,053,252 A * | 10/1991 | Kimura et al. | 427/164 |
| 5,514,217 A * | 5/1996 | Niino et al. | 118/723 MW |
| 5,595,792 A * | 1/1997 | Kashiwaya et al. | 427/570 |
| 6,220,202 B1 * | 4/2001 | Foster et al. | 118/723 E |
| 2001/0050057 A1 * | 12/2001 | Yonezawa et al. | 118/718 |
| 2002/0144656 A1 * | 10/2002 | Yoshikawa et al. | 118/718 |
| 2002/0170877 A1 * | 11/2002 | Fazio et al. | 216/24 |
| 2003/0172873 A1 * | 9/2003 | Fischer et al. | 118/718 |
| 2004/0149214 A1 * | 8/2004 | Hirose et al. | 118/715 |
| 2005/0255257 A1 * | 11/2005 | Choi et al. | 427/585 |
| 2005/0274319 A1 * | 12/2005 | Strip et al. | 118/506 |
| 2007/0134426 A1 * | 6/2007 | Hayashi et al. | 427/398.1 |

FOREIGN PATENT DOCUMENTS

| | | |
|---|---|---|
| JP | 07-233474 A | 9/1995 |
| JP | 2000-054151 A | 2/2000 |
| JP | 2002-151513 A | 5/2002 |
| JP | 2002-212744 A | 7/2002 |
| JP | 2002-339075 A | 11/2002 |
| JP | 2003-179043 A | 6/2003 |

* cited by examiner

WINDING TYPE PLASMA CVD APPARATUS

TECHNICAL FIELD

This invention relates to a winding type plasma CVD apparatus for forming a deposition layer on a film by plasma CVD while the film is made to travel under a reduced pressure atmosphere.

BACKGROUND ART

Conventionally, for example, a winding type vacuum deposition apparatus is utilized to serially form a deposition layer on a lengthy film or a film substrate (refer to following Patent Documents 1 and 2). In the winding type plasma CVD apparatus, a film unwound from an unwinding portion is made to travel at a constant velocity, and a deposition layer is formed on the film at a deposition position by means of plasma CVD technique, and afterward the film is wound up to a winding portion.

FIG. 7 shows a construction of a prior art winding type plasma CVD apparatus. In the prior art winding type plasma CVD apparatus, a film 3 is fed out from an unwind roller 2 in a vacuum chamber 1. The film 3 is led through plural assistance rollers 4 to a periphery surface of a drum roller 5 having a heat source, and afterward the film is wound up to a winding roller 7 through plural assistance rollers 6. The drum roller 5 is connected to ground potential and is placed at a position facing a high-frequency electrode 8 of which the shape is a circular arc. Reaction gas is supplied between the drum roller 5 and the high-frequency electrode 8 through a gas feed line 9, and then plasma of the reaction gas is generated, so that the reaction product is deposited onto the film wound around the drum roller 5.

In this winding type plasma CVD apparatus, the vacuum chamber 1 is sectioned in a reaction chamber 10 and a non-reaction chamber 11 by sealing means 14 placed around the drum roller 5. Further, the reaction chamber 10 is evacuated through an evacuation line 12 and the non-reaction chamber 11 is pressurized by introducing auxiliary gas from an auxiliary gas introduction line 13, and thereby flow of the reaction gas introduced into the reaction chamber 10 toward the non-reaction chamber 11 side is restrained.

Patent Document 1: JP2002-212744A
Patent Document 2: JP7-233474A
Patent Document 3: JP2003-179043A

DISCLOSURE OF INVENTION

Problem to be Solved by the Invention

In the above winding type plasma CVD apparatus, because the deposition layer is formed in a condition that the film is wound around the surface of the drum roller 5, the high-frequency electrode 8 for forming plasma is formed in the shape of a circular arc along the surface of the drum roller 5.

However, in such a construction, it is difficult to supply reaction gas uniformly in the whole deposition area of the film. Therefore, uniform plasma can not be generated, so that it is hard to uniformly form the deposition layer on the film 3. Further, because it is necessary that the high-frequency electrode 8 is formed in the shape of the cylinder concentric with the drum roller 5, the gap between the high-frequency electrode 8 and the drum roller 5 can not be adjusted easily, and preparation of the high-frequency electrode 8 is not easy.

On the other hand, in the deposition process by plasma CVD, neighboring parts (shower plate, mask and so forth) located at the deposition position are polluted by the adhesion of the reaction product. Accordingly, it is necessary to restrain the generation rate of the dust to be low by cleaning up the reaction chamber regularly. As a cleaning process for the reaction chamber, there is a self-cleaning method that removes the deposits by a cleaning gas plasma by introducing cleaning gas into the reaction chamber instead of reaction gas (refer to the above Patent Document 3).

However, in the above winding type plasma CVD apparatus, the film 3 wound around the drum roller 5 always faces the high-frequency electrode 8, and the film 3 and the neighboring parts are polluted by the cleaning gas plasma, so that the self-cleaning of the deposition portion cannot be carried out in the path of the deposition process applied to the film 3.

This invention has been made in consideration of the above problems. It is an object of this invention to provide the winding type plasma CVD apparatus in which quality of a layer can be made uniform by supplying a reaction gas uniformly to the deposition area, and adjustment of the gap between the high-frequency electrode and the counter electrode can be easily carried out.

Further, it is another object of this invention to provide a winding type plasma CVD apparatus in which a self-cleaning process of the deposition portion can be carried out in the path of deposition applied onto the film.

Means to Solve the Problem

A winding type plasma CVD apparatus comprises an upstream roller and a downstream roller arranged on the upstream side and downstream side of a deposition position with regard to the traveling direction of a film, which make the film travel substantially linearly at the deposition position, wherein a high-frequency electrode facing the deposition surface of the film and connected to a high-frequency power source; a counter electrode arranged on the back side of the deposition surface of the film; and gas supply means supplying source gas to the deposition surface of the film, are arranged at the deposition position.

In this invention, the film is made to travel substantially linearly between the high-frequency electrode and the counter electrode in a condition that the film is supported by the upstream roller and the downstream roller. Source gas is supplied toward the deposition surface of the film. Plasma of the source gas is generated by applying high-frequency voltage to the high-frequency electrode. Reaction product is deposited onto the deposition surface of the film during its travel, so that the deposition layer is serially formed on the deposition surface.

Setting of the gap between the film and the high-frequency electrode becomes easy by means of adjustment of the height position of the upstream roller and the downstream roller because the film is supported linearly. Also, because the high-frequency electrode and the counter electrode can be formed flatly together, the adjustment of the gap between both the electrodes can be performed easily. Further still, the construction of both the electrodes can be simplified and manufacturing of these becomes easy.

In this invention, the gas supply means includes a shower plate attached to the high-frequency electrode; a space portion formed between the high-frequency electrode and the shower plate; and a gas feed line communicating with the space portion and supplying gas to the deposition surface of the film through the shower plate. According to this construction, reaction gas is uniformly supplied to the deposition area of the film, and thereby plasma is uniformly generated and a homogeneous layer can be obtained.

It is preferable to have a construction that can uniformly heat the film at the deposition position. This invention includes a metal belt made to travel with the film at the deposition position. The metal belt circulates in the vacuum chamber. The metal belt is heated at a constant temperature and is made to travel facing the back side of the film. The metal belt can be comprised separately from the counter electrode. Further, it may be constituted as the counter electrode.

On the other hand, this invention comprises a metal belt which is made to travel circularly in a vacuum chamber simultaneously on the back side of the deposition surface of the film; a mask having an aperture limiting deposition area of the deposition surface of the film; an adjustment mechanism adjusting the gap between the deposition surface of the film and the aperture of the mask; a shutter being able to close the aperture of the mask by means of being inserted between the deposition surface of the film and the aperture of the mask; and feeding means for cleaning gas.

In this construction, the deposition surface of the film can be shielded from the plasma formation space with the shutter, and the self-cleaning process of the deposition portion can be performed in the path of deposition onto the film. In this case, the cleaning gas, for example having corrosiveness, and its decomposition product are restrained from being scattered to the film and neighboring mechanism elements. The shutter can function as the counter electrode. Further, feeding means for the cleaning gas can be constituted by a gas supply means to supply reaction gas.

The adjustment mechanism can comprise a roller transfer unit lifting an upstream roller and a downstream roller, which guide travel of the film and the metal belt, and a belt tension adjustment unit adjusting tensile force of the metal belt.

EFFECT OF THE INVENTION

As above described, according to the winding type plasma CVD apparatus of this invention, quality of the deposition layer formed on the film can be uniform, and adjustment of the gap between the high-frequency electrode and the counter electrode can be performed easily, according to the deposition condition.

Further, the self-cleaning process of the deposition portion can be performed in the path of deposition onto the film, and therefore deterioration of the working efficiency of the apparatus can be restrained. Furthermore, a deposition of high quality can be processed.

Figure 1:
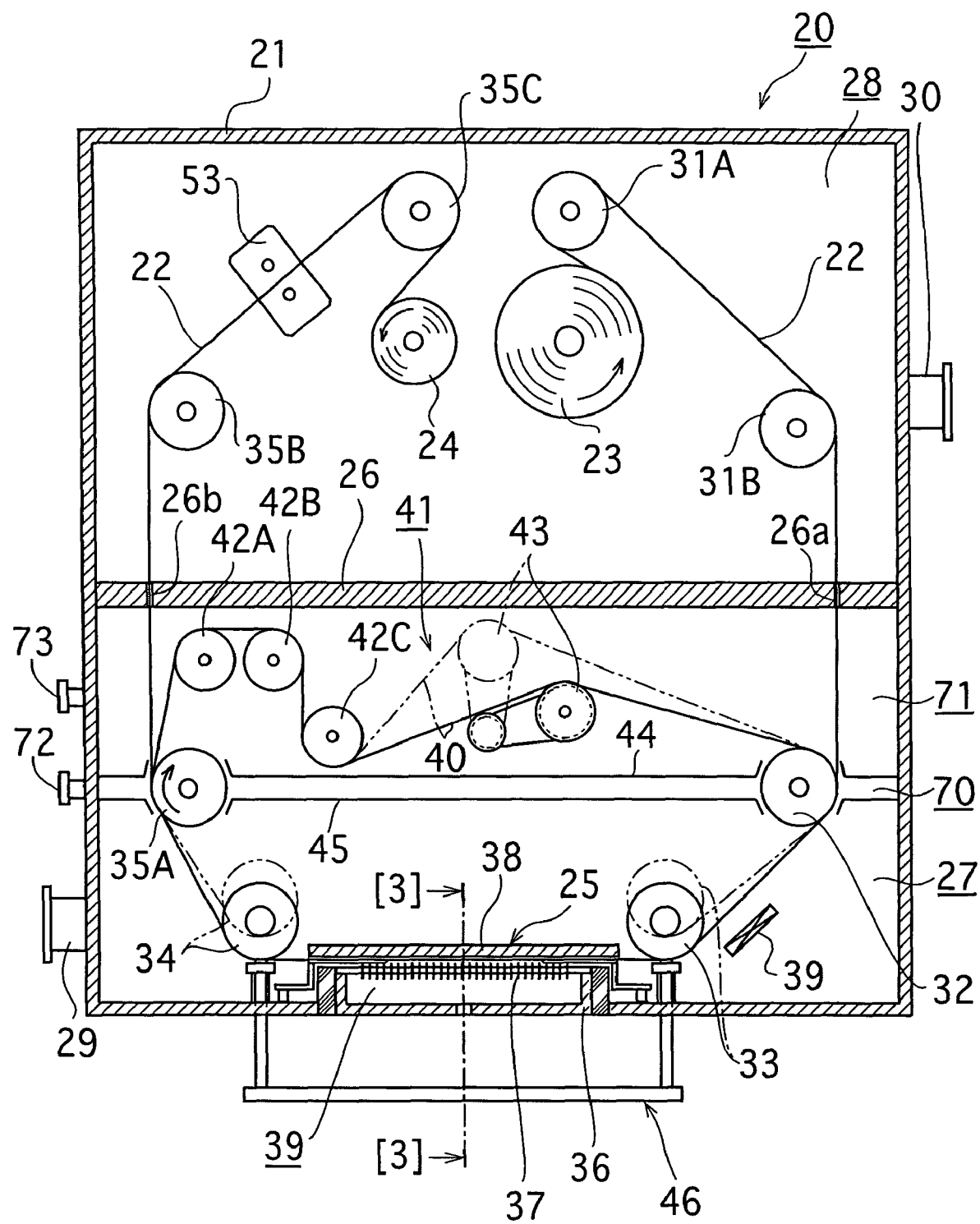
FIG. 1 is a schematic view of a winding type plasma CVD apparatus according to one embodiment of this invention.

EXPLANATIONS OF LETTERS OR NUMERALS 20 winding type plasma CVD apparatus
21 vacuum chamber
22 film
23 unwinding roller
24 winding roller
25 deposition portion
27 reaction chamber
29 vacuum exhaust port
32 heating roller
33 upstream movable roller
34 downstream movable roller
36 high-frequency electrode
37 shower plate
38 anode electrode (counter electrode)
40 metal belt
41 belt traveling unit
43 movable roller
46 lifter
47 high-frequency power source
49 space portion
50 gas feed line
51 mask
52 aperture
53 charge neutralization unit
56 rotating shaft
57 support bracket
60 upper hook (engaging click)
61 lower hook
65 shutter

BEST MODE FOR CARRYING OUT THE INVENTION

Next, an embodiment of this invention will be described with reference to the drawings.

FIG. 1 shows a schematic view of a winding type plasma CVD apparatus 20 according to one embodiment of this invention. The winding type plasma CVD apparatus 20 comprises a vacuum chamber 21, an unwinding roller 23 which unwinds a film 22 on which a deposition layer is formed, a winding roller 24 which winds up the film 22, and a deposition portion 25 at which the deposition layer is formed.

The inside of the vacuum chamber 21 is sectioned into a reaction chamber 27 and a non-reaction chamber 28 by a partition board 26. The deposition portion 25 is arranged in the reaction chamber 27. The unwinding roller 23 and the winding roller 24 are arranged in the non-reaction chamber 28. Vacuum exhaust ports 29 and 30 are respectively connected to the reaction chamber 27 and the non-reaction chamber 28, and therefore each chamber can be evacuated independently. In this embodiment, the reaction chamber 27 is maintained, for example, under dozens of Pa to several hundred Pa of pressure. The vacuum exhaust port 29 of the reaction chamber 27 side is placed near the deposition portion 25.

The partition board 26 has two slots 26a and 26b. One slot 26a is for passing the film 22 from the unwinding roller 23 to the deposition portion 25. Other slot 26b is for passing the film 22 from the deposition portion 25 to the winding roller 24.

The film 22 is a lengthy flexible film which is cut to a predetermined width. For example, a glass film or a resin film of which thickness is 70 μm is used. Resin film of which the heat proof temperature is equal to or more than 200 degrees Celsius (° C.) is preferred, such as polyimide film, polyamide film and aramid film. The traveling speed of the film 22 is, for example, 0.1 m/min from 0.01 m/min.

Plural assistance rollers 31A and 31B, a heating roller 32 and an upstream movable roller 33 are arranged sequentially on the film path from the unwinding roller 23 to the deposition portion 25, respectively, in order to guide the travel of the film 22. Further, a downstream movable roller 34 and plural assistance rollers 35A, 35B and 35C are arranged sequentially on the film path from the deposition portion 25 to winding roller 24, respectively, in order to guide the travel of the film 22. An assistance roller 35B has the function of a cooling roller.

The heating roller 32 has heating means such as a heater. The film 22 is heated at a predetermined temperature (for example, 200-250° C.) while it is made to travel. If necessary, an auxiliary heater 39 for heating the deposition surface of the film 22 may be installed between the heating roller 32 and the upstream movable roller 33, as shown in FIG. 1.

The upstream movable roller 33 and the downstream movable roller 34 correspond to "an upstream roller" and "a downstream roller" of this invention, respectively. These rollers make the film 22 travel substantially linearly (horizontally) at the deposition portion 25 (deposition position). As discussed below, these upstream movable roller 33 and downstream movable roller 34 can be lifted (moved up and down) between the self-cleaning position as shown in the continuous line and the deposition position as shown in the two-dot chain line in FIG. 1 by a lifter 46 installed outside of the vacuum chamber 21.

The deposition portion 25 is placed between the upstream movable roller 33 and the downstream movable roller 34. The deposition portion 25 comprises a high-frequency electrode 36 facing the deposition surface of the film 22, a shower plate 37 attached to the high-frequency electrode 36, and an anode electrode 38 facing the back side of the deposition surface of the film 22. Source gas is supplied through shower plate 37 to the deposition surface of the film 22, and plasma of the source gas is generated between the high-frequency electrode 36 and the film 22. A layer is formed by depositing the reaction product of the source gas onto the deposition surface of the film 22 which is made to travel. The anode electrode 38 is constructed as a counter electrode and is connected to ground potential. The anode electrode is heated at a temperature similar to the heating roller 32 in order that the temperature of the film 22 is made to be uniform.

Charge neutralization unit 53 is provided between the assistance roller 35B and the winding roller 24. This charge neutralization unit 53 is installed for the purpose of removing a charge on the film 22, electrically. As one construction of the charge neutralization unit 53, a construction that dielectrifies the film 22 by plasma bombardment treatment can be adopted.

Next, a metal belt 40 is made to travel circularly in the reaction chamber 27. This metal belt 40 is an endless belt made of stainless steel. The metal belt is made to travel with the film 22 on the back side of the deposition surface of the film 22, while the film 22 passes the heating roller 32, the upstream movable roller 33, the downstream movable roller 34 and the assistance roller 35A. The Electric potential of the metal belt 40 is ground potential that is identical with the potential of the anode electrodes 38.

Plural guide rollers 42A, 42B and 42C and a movable roller 43 are respectively arranged on the belt traveling path between the assistance roller 35A and the heating roller 32. These plural rollers 42A, 42B and 42C guide the travel of the metal belt 40. The movable roller 43 adjusts tensile force of the metal belt 40. Belt traveling unit 41 is comprised of the heating roller 32, the upstream movable roller 33, the downstream movable roller 34, the assistance roller 35A, guide rollers 42A, 42B and 42C, and the movable roller 42. A way of adjustment of the tension of the metal belt 40 is accomplished by two methods. One is adjusted by moving of the movable roller 43. The other is adjusted by a tension roller installed separately from the movable roller 43.

Partition plates 44 and 45 are installed between the heating roller 32 and the assistance roller 35A, respectively, in the reaction chamber 27. An intermediate chamber (buffer chamber) 70 is formed between the partition plate 44 and the partition plate 45. There is a travel chamber 71 between the partition board 26 and the partition plate 44. Vacuum exhaust ports 72 and 73 are connected to the intermediate chamber 70 and the travel chamber 71 respectively, and therefore each chamber can be evacuated independently. Accordingly, the reaction gas (source gas) and the cleaning gas, which are introduced into the deposition portion 25, and these plasma products are restrained from polluting the belt traveling unit 41 by their scatter and deposition.

Figure 2:
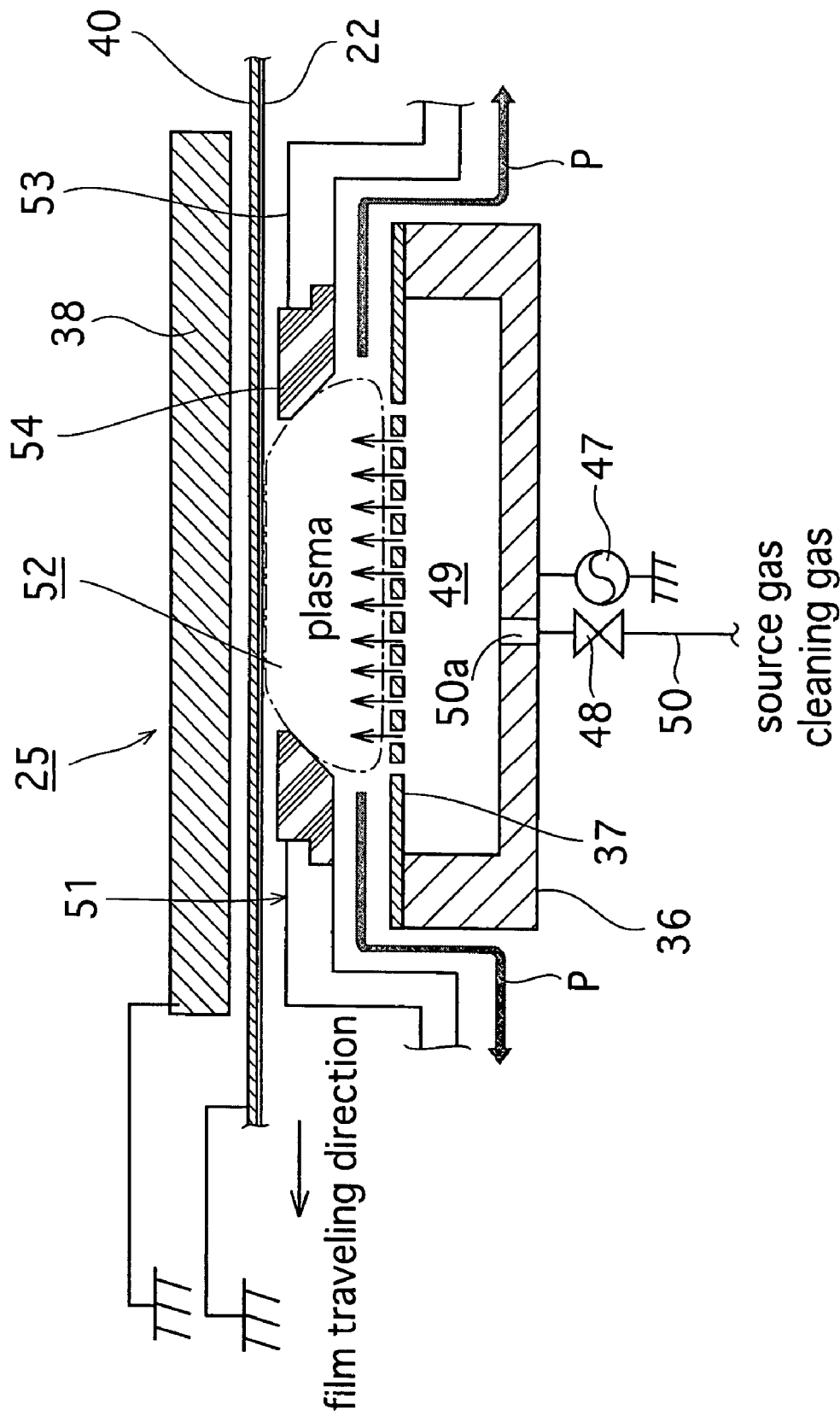
FIG. 2 is a schematic view of deposition portion 25.

FIG. 2 is a schematic view of the deposition portion 25.

The high-frequency electrode 36 is connected to a high-frequency power source 47. Power frequency of the high-frequency power source 47 can be adopted within a range of from 100 kHz to 100 MHz, according to the condition of the plasma forming. The high-frequency electrode 36 has a container shape. A space portion 49 of a predetermined volumetric capacity is formed inside of the high-frequency electrode 36. The shower plate 37 is attached at the upper end of the high-frequency electrode 36. The shower plate 37 faces the deposition surface of the film 22 at the deposition portion 25.

The shower plate 37 functions as a part of the high-frequency electrode. The shower plate forms a plasma forming space of source gas between the shower plate 37 and the film 22, by collaborating with the anode electrodes 38 connected to ground potential. The source gas is introduced into the space portion 49 from a gas feed line 50 through a modulating flow valve 48 and a gas introduction port 50a, and thereby the source gas is supplied uniformly to the plasma forming space from each hole of the shower plate 37. "Gas supply means" of this invention is comprised of the shower plate 37, space portion 49, the gas feed line 50 and the gas introduction port 50a.

The kind of the source gas to be used is not limited in particular and can be chosen appropriately according to the kind of deposition material of the layer to be deposited onto the film 22. In this embodiment, various kinds of functional layers for TFT (Thin Film Transistor) are formed on the film 22 by plasma CVD technique.

For example, deposition material is silicon, silicon nitride, silicon oxide, oxynitriding silicon or an admixture of these silicon materials and at least one of boron (B) and phosphorus (P). In this case, as examples of source gas, a mixed gas of $SiH_4$ and $H_2$ can be used when forming a deposition layer of amorphous silicon, and a mixed gas of $SiH_4$, $PH_3$ and $H_2$ can be used when forming a layer of P doped n$^+$ type amorphous silicon. Further still, when forming a deposition layer of SiN, a mixed gas of $SiH_4$, $NH_3$ and $N_2$, or a mixed gas of $SiH_4$, $N_2O$ and Ar can be used.

The source gas is supplied to the deposition portion 25 from the gas feed line 50 in the deposition mode. On the other hand, fluorine containing gas, such as $NF_3$, can be introduced to the deposition portion 25 from the gas feed line 50, as the cleaning gas which is supplied in the self-cleaning mode. $NF_3$ gas is corrosive gas.

Next, a mask 51 is arranged between the shower plate 37 and the deposition surface of the film 22. At least the upper portion of the mask 51 is made of insulating material such as ceramic. The mask 51 has an aperture 52 limiting the deposition area within the deposition surface of the film 22. The mask 51 comprises a mask body 53 having a crank shape, and a mask edge 54 forming the aperture 52. Parts of the side and the top surfaces of the high-frequency electrode 36 are covered with the mask body 53. As shown in arrow P in FIG. 2, flow paths of gas are formed between the mask 51 and the high-frequency electrode 36. The gas is led to the vacuum exhaust port 29 (FIG. 1) through the flow paths.

FIG. 3 to FIG. 6 are cross sectional lateral views of the deposition portion 25 in a view as seen from the travel direction of the film 22. Construction of the upstream movable roller 33 side is shown in the figures. Although the construction of the downstream movable roller 34 side is not shown in these figures, it is similar to the construction of the upstream movable roller 33 side.

Winding type plasma CVD apparatus 20 of this embodiment has a shutter 65 which can open or close the aperture 52 of the mask 51. Self-cleaning mode of the deposition portion 25 can be performed by introducing cleaning gas from the gas introduction port 50a after closing the aperture 52 with the shutter 65.

Both ends of the rotating shaft 56 of the upstream movable roller 33 (and, that of the downstream movable roller 34, as well) are supported by support brackets 57, and therefore the traveling position of the film 22 is regulated. The support brackets 57 are connected to the lifter 46 located outside of the bottom of the vacuum chamber 21 through the lifter pins 58. Thus, the upstream movable roller 33 can be moved up and down by the drive of the lifter 46.

The lifter pins 58 are inserted into vacuum bellows 59 installed between the support bracket 57 and the bottom wall of the vacuum chamber 21, and therefore the pressure-tight seals between the bottom wall of the vacuum chamber 21 and the lifter pins 58 are held.

Figure 3:
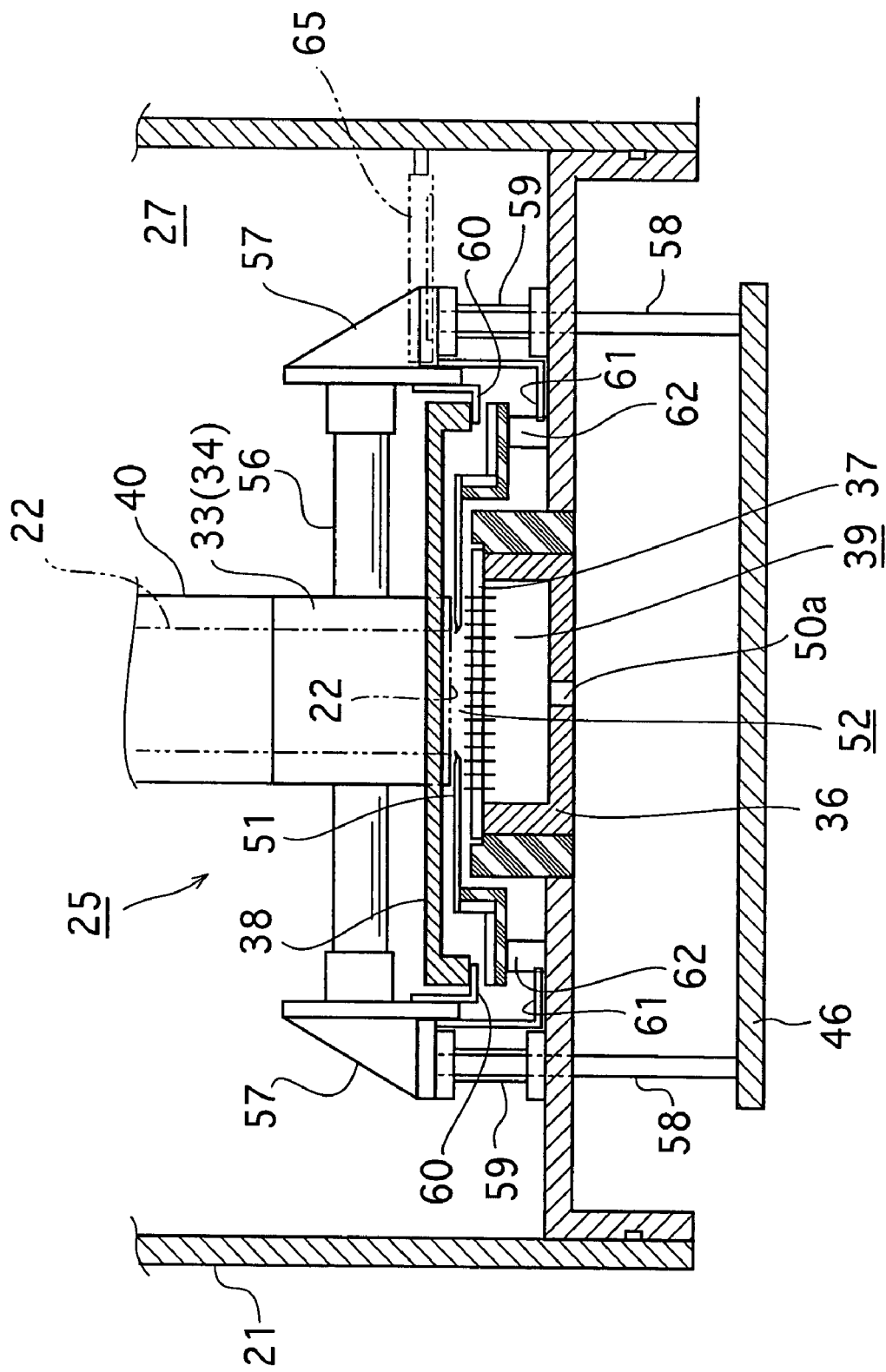
FIG. 3 is a cross sectional view as seen along section line [3]-[3] in FIG. 1.

FIG. 3 shows the condition of the deposition process of the film 22. The width of the upstream movable roller 33 is larger than that of the film 22 and is substantially identical with that of the metal belt 40. When the upstream movable roller 33 is positioned at the deposition position as shown in the figure, the film 22, travel of which should be guided by the upstream movable roller 33, and the metal belt 40 pass through between the anode electrodes 38 and the mask 51. Then, the anode electrode 38 is supported by L-shaped upper hooks 60 attached to the support bracket 57. The upper hooks correspond to "engaging clicks" of this invention. The mask 51 is supported by support block 62 attached to the inner surface of the bottom wall of the vacuum chamber 21. Therefore, the height positions of the anode electrode 38 and the mask 51 are regulated, respectively.

In this condition, the distance between the film 22 and the shower plate 37 is adjusted so as to be equal to 10 mm or more and 50 mm or less, and more preferably to 15 mm or more and 25 mm or less. The distance is adjusted by movement of the lifter 46 in the height direction. If the distance between the film 22 and the shower plate 37 is smaller than 10 mm, the area where plasma is generated becomes small, and therefore reaction of the gas does not advance. Further, if the distance is more than 50 mm, the deposition rate becomes lower, and therefore productivity is deteriorated.

Figure 4:
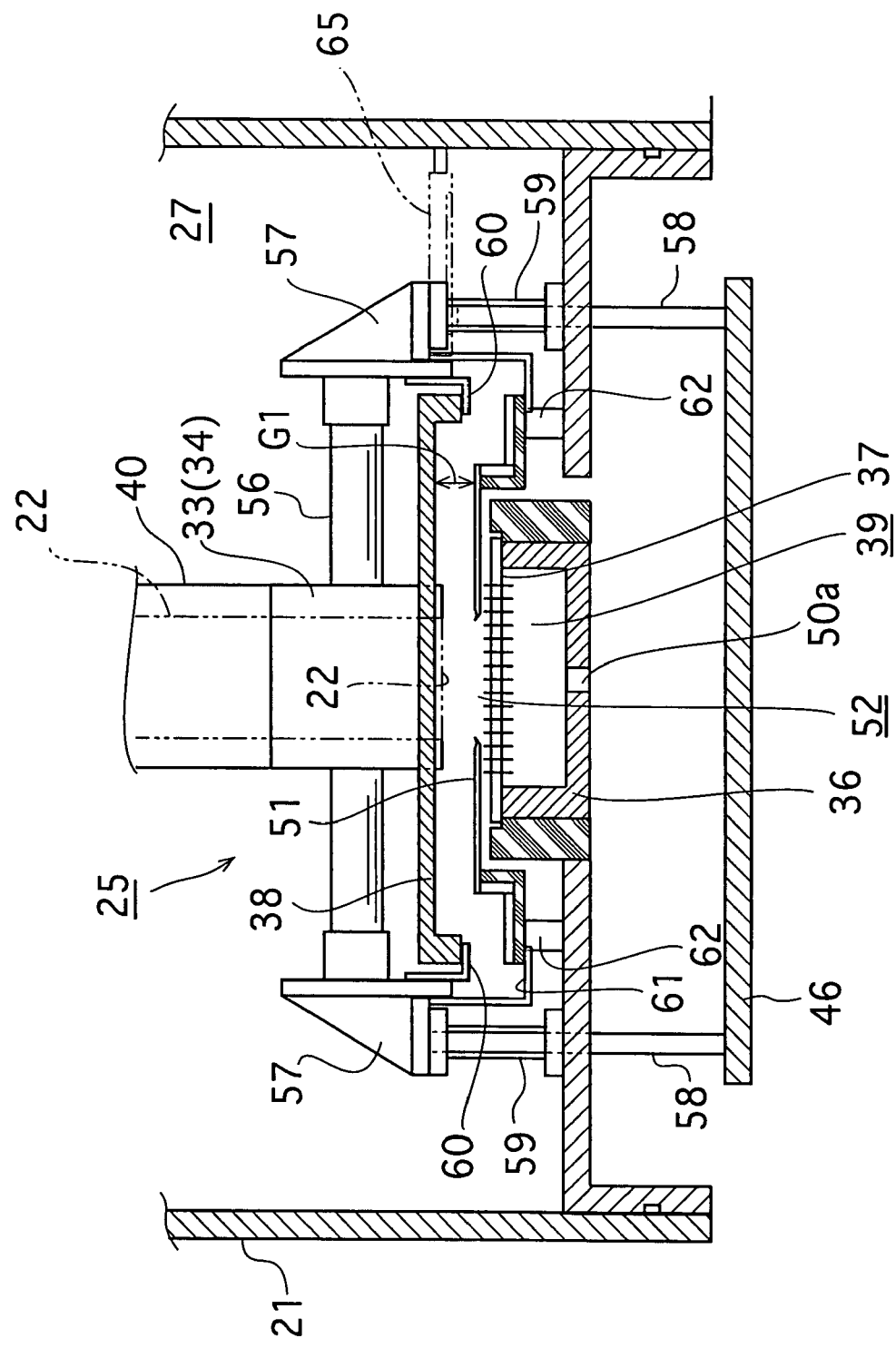
FIG. 4 is a cross sectional lateral view of deposition portion 25 illustrating one transference process to the self-cleaning mode.

The lifter 46, which is shown in the figure partially, has an air cylinder or a motor as the drive source. As shown in FIG. 4, the lifter 46 can lift the anode electrode 38 to the position which forms the gap G1 between the anode electrode 38 and the mask 51, by removing the anode electrodes 38 from the mask 51 with the upper hooks 60. Further still, as shown in FIG. 5, the lifter 46 can lift the mask 51 to the position which forms the gap G2 between the mask 51 and the shower plate 37, by removing the mask 51 from the shower plate 37 with L-shaped lower hooks 61 attached to the support brackets 57.

Figure 5:
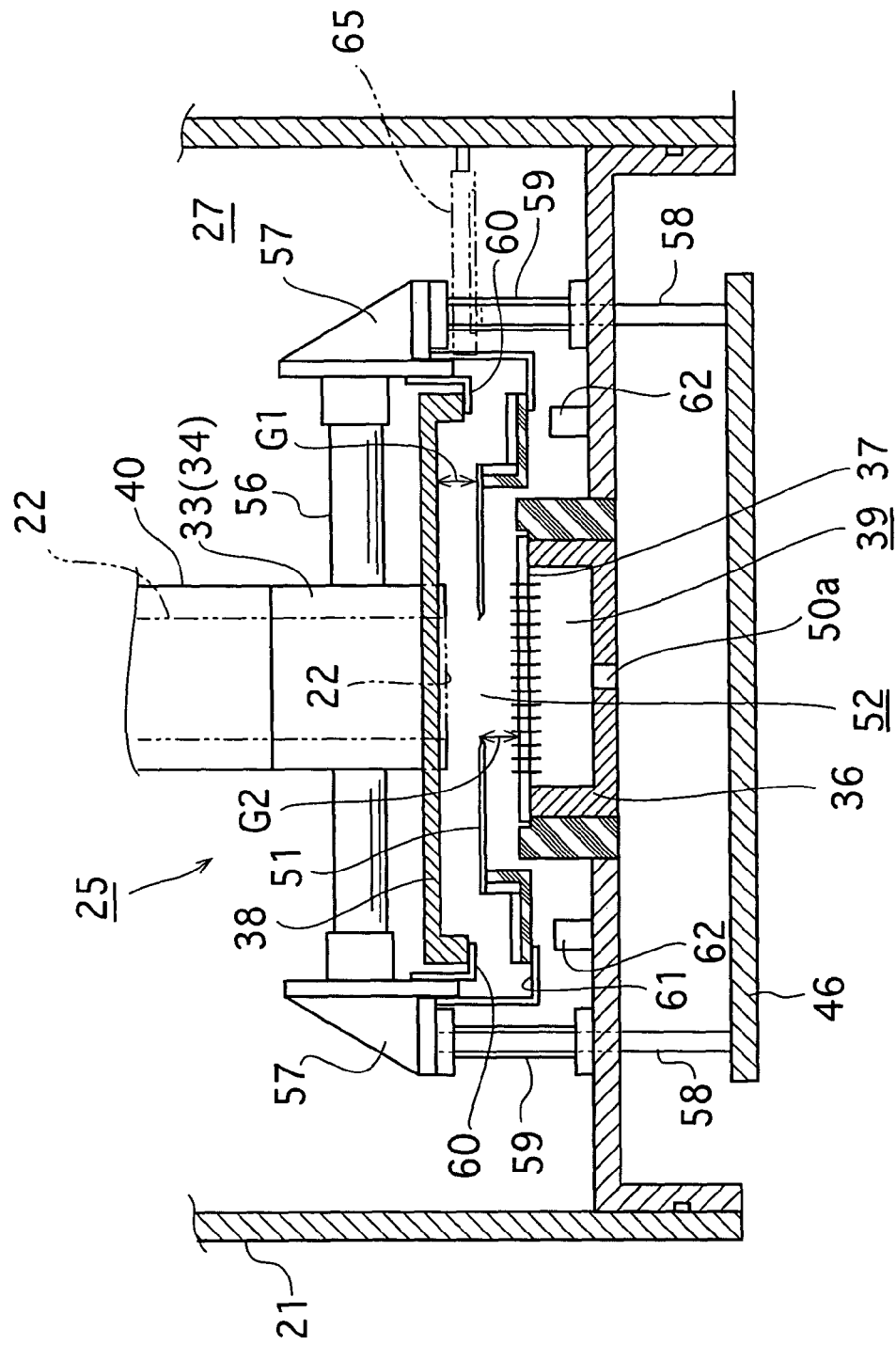
FIG. 5 is a cross sectional lateral view of deposition portion 25 illustrating the other transference process to the self-cleaning mode.
Figure 6:
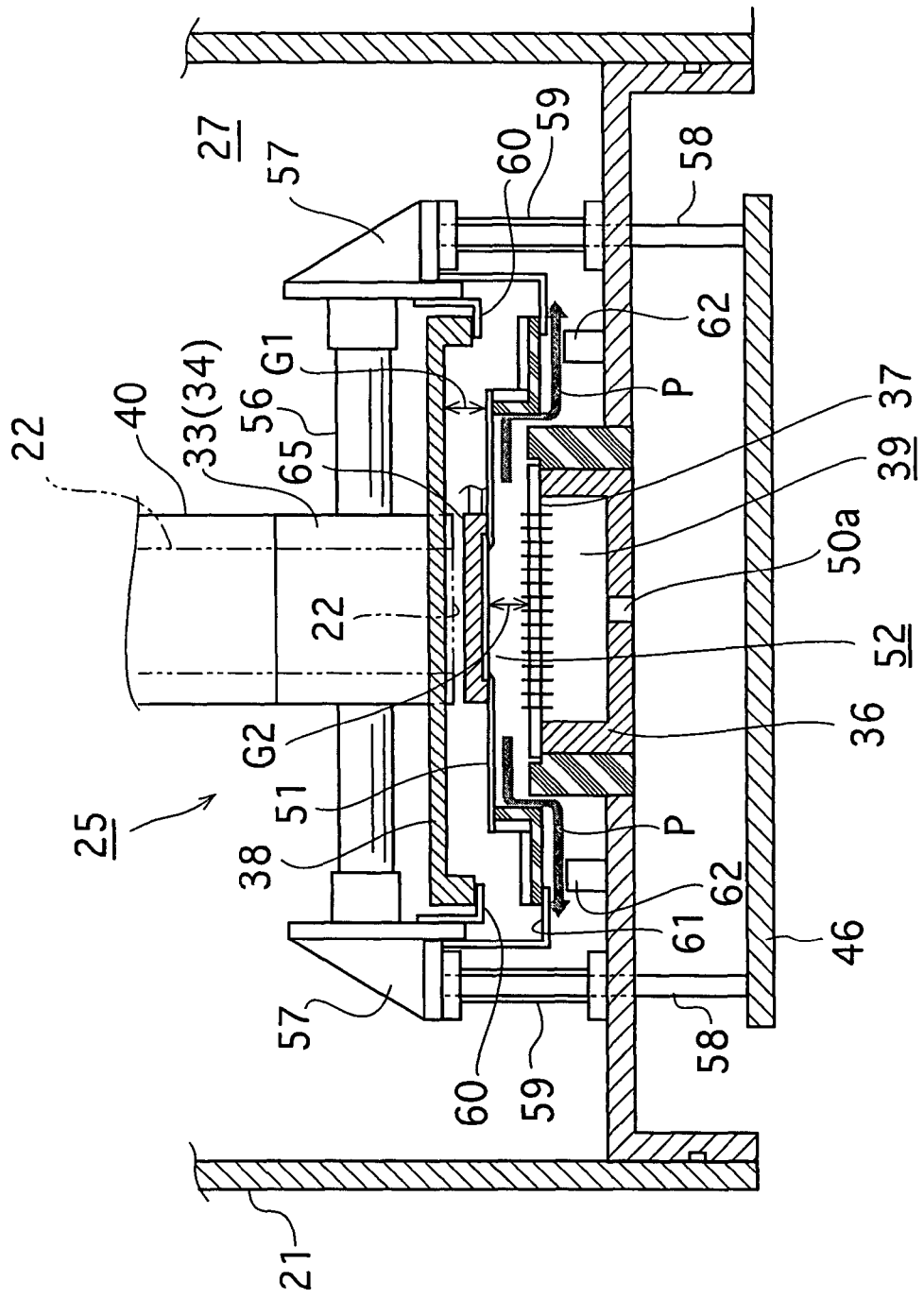
FIG. 6 is a cross sectional lateral view of deposition portion 25 in the self-cleaning mode.
Figure 7:
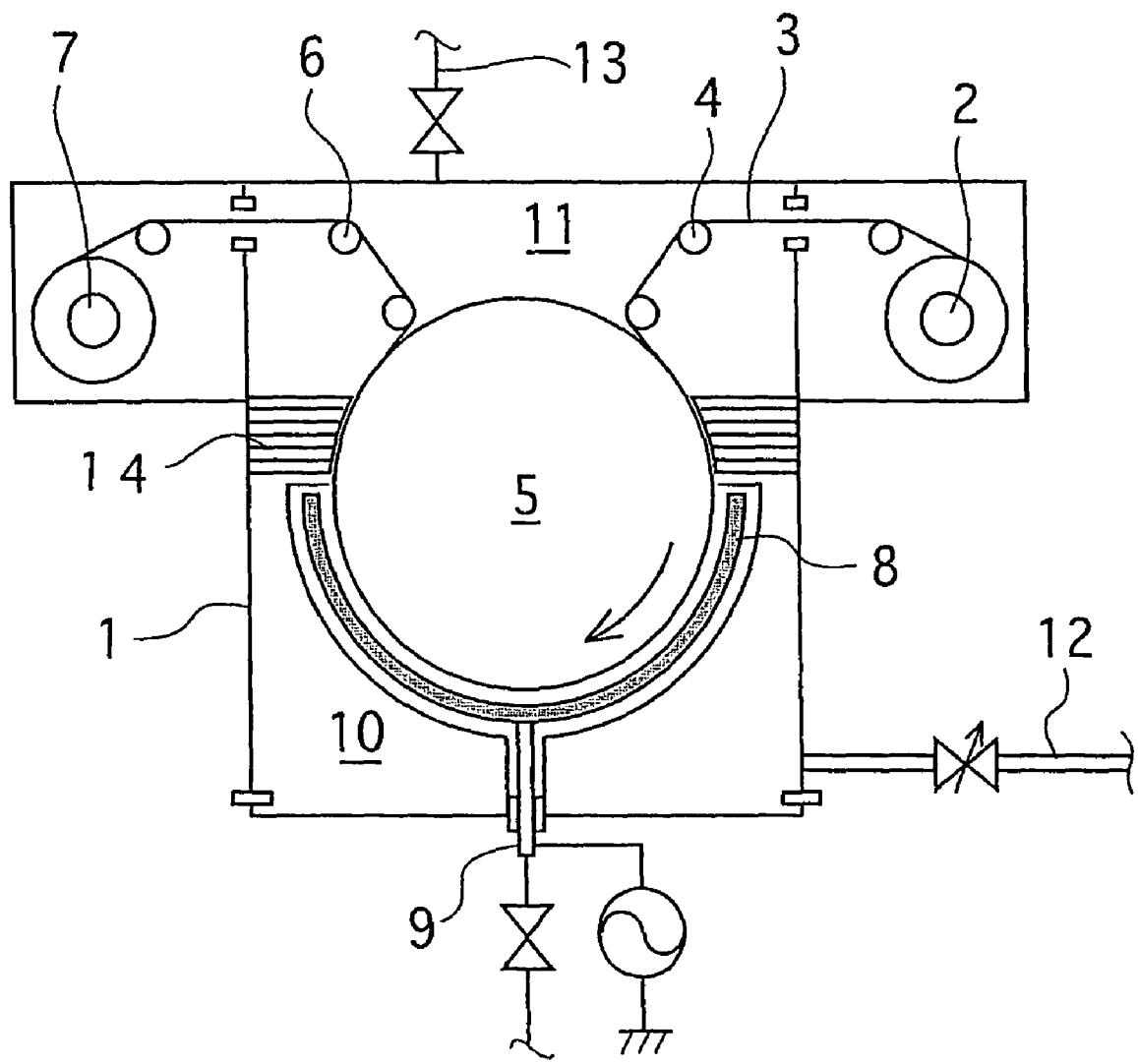
FIG. 7 is a schematic view of a prior art winding type plasma CVD apparatus.

Next, the shutter 65 is on stand-by at the position near the deposition portion 25 in the reaction chamber 27, as shown in FIG. 3 to FIG. 5. The aperture 52 of the mask 51 can be closed by closing the shutter 65 in the gap G1 formed between the anode electrode 38 and the mask 51, as shown in FIG. 6. The shutter 65 is made of metal, and is connected to ground potential. Further, the shutter 65 faces the shower plate 37 through the mask opening 52, and sections the plasma forming space between the shutter 65 and the shower plate 37.

The film 22 and the metal belt 40 which are supported by the upstream movable roller 33 and the down stream movable roller 34 are slackened by tensile deterioration, with the upward movements of the upstream movable roller 33 and the downstream movable roller 34. The slack of the metal belt 40 is canceled by movement of the movable roller 43 of the belt traveling unit 41 to the position shown in the two-dot chain line in FIG. 1. The slack of the film 22 is canceled, for example, by back torque of the unwinding roller 23, or tension control or torque control of the winding roller 24.

A "roller transfer unit" of this invention is comprised of the lifter 46, the support brackets 57 and the upper hooks 60. Further, an "adjustment mechanism" is comprised of the roller transfer unit and the movable roller 43 which constitutes the belt traveling system 41.

Next, operation of the winding type plasma CVD apparatus 20 of this embodiment will be described.

Referring to FIG. 1, the film 22 unwound from unwinding roller 23 is wound up to the winding roller 24, through the assistance rollers 31A and 31B, the heating roller 32, the upstream and downstream movable rollers 33 and 34, and the assistance rollers 35A, 35B and 35C. Now, the upstream movable roller 33 and the downstream movable roller 34 are respectively positioned at the deposition position shown by the continuous line in FIG. 1.

On the other hand, the metal belt 40 is made to travel with the film 22 on the heating roller 32, the upstream movable roller 33, the downstream movable roller 34 and the assistance roller 35A. The travel of the metal belt 40 is guided by the movable roller 43 at the position shown by the continuous line in FIG. 1.

In the deposition process, the film 22 unwound from the unwinding roller 34 joins the metal belt 40 on the heating roller 32. The heating roller 32 is heated at the reaction temperature (200 to 250° C.) that is necessary for the deposition process of the film. Thus, the film 22 is heated by the heating roller 32 through the metal belt 40 located on the back side (opposite side of the deposition surface) of the film 22. If necessary, the film 22 is heated by the auxiliary heater 39.

Because the film 22 is heated through the metal belt 40, the heating efficiency of the film 22 is raised and the consumption of electric power of the heat source can be reduced. Further, because the metal belt 40 is made to travel with the film 22 in one body, the friction between the metal belt 40 and the film 22 is eliminated, and the film 22 can be protected.

The film 22 heated with the heating roller 32 is transported to the deposition portion 25 with the metal belt 40. In the deposition portion 25, the film 22 faces the shower plate 37 with a constant distance, as shown in FIG. 2. The opposed distance is equal from 50 mm to 10 mm as above described. The distance is appropriately adjustable according to the plasma formation condition.

According to this embodiment in particular, the film 22 can be made to travel substantially linearly at the deposition position, by means of the upstream and downstream movable rollers 33 and 34. Therefore, the adjustment of the distance between the film 22 and the shower plate 37 can be performed easily. Further, the shower plate 37 can be formed flatly.

Forming the deposition layer on the film 22 is carried out in such a manner that the plasma of the source gas supplied from the shower plate 37 is generated by applying high-frequency voltage to the high-frequency electrode 36, and then the reaction product is made to deposit onto the traveling film 22. The deposition area of the film 22 is limited by mask 51. The metal belt 40 functions as an anode electrode (a counter electrode).

The space portion 49 formed inside of the high frequency electrode 36 functions as a buffer space of the source gas introduced from the gas introduction port 50a, and the source gas is supplied to the plasma forming space through each aperture of the shower plate 37 uniformly from the space portion 49. Accordingly, uniform plasma can be generated for the film 22, and homogenizing of the deposition layer can be obtained.

The layered film 22 is separated from the metal belt 40 on the assistance roller 35A and is cooled to a predetermined temperature on the assistance roller 35B. The cooled film 22 is diselectrified by the charge neutralization unit 53, and afterward the film 22 is wound up to the winding roller 24. Accordingly, the generation of wrinkles or winding turbulence of the film 22 by a charge of electricity more than a predetermined value can be prevented.

The deposition process of the film 22 is carried out as above described. When the deposition process of the film 22 is performed in succession for a long time, the mass of deposit on the deposition portion 25, in particular to the shower plate 37 and the periphery of the aperture of the mask 51, is increased. If left alone, quality of the layer will be deteriorated by generation of dust, and the square measure of the aperture 52 will be changed. In this embodiment, the self-cleaning process of the deposition portion 25 is performed as follows.

In the self-cleaning process, the supply of the source gas to the deposition portion 25 is stopped, and travel of the film 22 and the metal belt 40 are stopped, too. Afterwards, the upstream movable roller 33, the downstream movable roller 34, the anode electrode 38 and the mask 51 are sequentially moved to the upward self-cleaning position by lifter 46, as shown in FIG. 4 and FIG. 5.

The slack in the film 22 and the metal belt 40 generated with upward movement of the movable roller 33 and 34, are canceled by the revolution control of unwinding roller 23 or winding roller 24, or movable roller 43, as above described.

Next, the shutter 65 is moved to upward of the mask aperture 52 through the gap G1 between the anode electrode 38 and the mask 51, and afterward the aperture 52 is closed with the shutter 65 by further upward movement of the mask 51 as shown in FIG. 6. Then subsequently, cleaning gas is introduced from the gas introduction port 50a, and the plasma of the cleaning gas is generated between the shower plate 37 and the shutter 65, so that the deposition which is deposited onto the shower plate 37 and the mask 51 is decomposed and removed.

The self-cleaning process of the deposition portion 25 is performed as above described. In this embodiment, the self-cleaning can be carried out in the condition which the film 22 is extended across the deposition portion 25, and therefore the deposition process of the film 22 can be restarted as soon as the self-cleaning process is finished. In the recommencement of the deposition, the mask 51, the anode electrode 38 and the movable rollers 33 and 34 are respectively returned to these deposition positions shown in FIG. 3, with the reverse operation of the lifter 46.

Further, even if corrosive gas is used for the cleaning gas introduced in the self-cleaning process, the scatter of the cleaning gas to a space on the mask 51 can be prevented because aperture 52 is closed with the shutter 65. Further, because the vacuum exhaust port 29 is exposed to the neighborhood of the deposition portion 25 as shown in FIG. 1, the introduced cleaning gas can be directly exhausted from the lateral side of the mask 51 to the vacuum exhaust port 29 along the flow paths shown in arrow P in FIG. 6, and therefore the scatter of the cleaning gas by detouring around the deposition portion 25 is prevented.

According to this embodiment, the self-cleaning process of the deposition portion 25 can be performed in the path of the deposition onto the film 22, and therefore the deterioration of the apparatus working efficiency is restrained and the quality of the deposition layer is held high.

While the preferred embodiment of this invention has been described, without being limited to this, variations thereto will occur to those skilled in the art within the scope of the present invention concepts.

For example, in the above embodiment, one of the metal belt 40 and the counter electrode 38 may be omitted because both have similar operations as the anode electrode.

Further, in the above embodiment, the film 22 and the metal belt 40 are removed from the shower plate 37 by lifting the upstream movable roller 33 and the downstream movable roller 34 in the self-cleaning process of the deposition portion 25. Instead, roller members which can be moved up and down may be installed between the upstream movable roller 33 and the deposition portion 25, and the deposition portion 25 and the downstream movable roller 34, respectively, and the film and the metal belt is made to thereby move with these roller members.

Further still, another material layer may be formed on the film at the deposition portion 25 by reversing the traveling direction of the film, after all of the layered film has been wound up to the winding roller 24. In this case, the unwinding roller 22 functions as a winding roller, and the winding roller 24 functions as a unwinding roller. Further, the assistance roller 35A may be constructed as a heating roller, and the assistance roller 31B may be constructed as a cooling roller, beforehand. Further still, a charge neutralization unit and an auxiliary heater may be installed in the necessary location beforehand.

The invention claimed is:

1. A winding type plasma CVD apparatus for forming a deposition layer on a deposition surface of a film by plasma CVD while said film is made to travel in a vacuum chamber, comprising:

an upstream roller and a downstream roller respectively arranged on the upstream side and downstream side of a deposition position with regard to the traveling direction of said film, which make said film travel substantially linearly at said deposition position;

a high-frequency electrode facing the deposition surface of said film and connected to a high-frequency power source;

a counter electrode arranged on a back side of the deposition surface of said film;

a gas feed line for supplying source gas toward the deposition surface of said film;

a mask arranged between said high-frequency electrode and said film, said mask having an aperture that limits a deposition area of the deposition surface of said film;

a lifting unit having a support bracket for simultaneously moving up and down said upstream roller, said downstream roller, and said mask;

wherein the support bracket supports both ends of a rotating shaft of said upstream roller and both ends of a rotating shaft of said downstream roller;

wherein engaging clicks are attached to the support bracket and engage said mask;

said lifting unit having a first state and a second state, said lifting unit in the first state causing said film to face said high-frequency electrode with a first distance between said film and said high-frequency electrode, said lifting unit in the second state causing said film to face said high-frequency electrode with a second distance between said film and said high-frequency electrode, the second distance being larger than the first distance, said lifting unit being configured for adjusting a distance between said film and said high-frequency electrode between the first state and the second state;

a shutter configured for being inserted between the deposition surface of said film and the aperture of said mask when said lifting unit is in the second state, said shutter being connected to ground potential; and wherein after said shutter is inserted between said film and said mask, said lifting unit moves up said mask to a position where said shutter closes the aperture of said mask.

2. A winding type plasma CVD apparatus according to claim 1 in which said gas supply means includes;

a shower plate attached to said high-frequency electrode, said shower plate having a plurality of hole portions, the plurality of hole portions being configured to eject the source gas in a direction toward the deposition surface of said film;

a space portion formed between said high-frequency electrode and said shower plate; and a gas feed line communicating with said space portion and supplying gas to toward the deposition surface of said film through said shower plate.

3. A winding type plasma CVD apparatus according to claim 2 in which the distance between said shower plate and the deposition surface of said film is from 10 mm to 50 mm when said lifting unit is in the first state.

4. A winding type plasma CVD apparatus according to claim 1 in which the frequency of said high-frequency electrode is from 100 kHz to 100 MHz.

5. A winding type plasma CVD apparatus according to claim 1 further comprising:

a heater unit for heating said film and arranged on the upstream side of said deposition position.

6. A winding type plasma CVD apparatus according to claim 1, further comprising:

a charge neutralization unit for neutralizing said film and arranged on the downstream side of said deposition position.

7. A winding type plasma CVD apparatus according to claim 1 in which the material of said deposition layer formed on the deposition surface of said film is silicon, silicon nitride, silicon oxide, oxynitriding silicon or an admixture of these silicon materials and at least one of boron and phosphorus.

8. A winding type plasma CVD apparatus according to claim 1, further comprising:

a metal belt supporting the back side of said film at said deposition position; and a belt traveling unit which causes said metal belt to travel circularly in said vacuum chamber.

9. A winding type plasma CVD apparatus according to claim 8, in which said upstream roller includes a heater unit for heating said film via said metal belt.

10. A winding type plasma CVD apparatus according to claim 8 in which said lifting unit further includes:

a tension adjustment unit for adjusting tension of said metal belt.

11. A winding type plasma CVD apparatus according to claim 1, further comprising:

flow paths of gas are formed between said mask and said high-frequency electrode.

12. A winding type plasma CVD apparatus according to claim 1 in which said gas feed line is connected to a cleaning gas supply source supplying cleaning gas, and said high-frequency electrode generating plasma of the cleaning gas between said high-frequency electrode and said mask, the aperture of said mask being closed by said shutter, when said lifting unit is in the second state.

* * * * *